United States Patent
M'Saad et al.

(10) Patent No.: US 6,667,248 B2
(45) Date of Patent: Dec. 23, 2003

(54) LOW-BIAS-DEPOSITED HIGH-DENSITY-PLASMA CHEMICAL-VAPOR-DEPOSITION SILICATE GLASS LAYERS

(75) Inventors: Hichem M'Saad, Santa Clara, CA (US); Chad Peterson, San Jose, CA (US); Zhuang Li, San Jose, CA (US); Anchuan Wang, Fremont, CA (US); Farhad Moghadam, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 248 days.

(21) Appl. No.: 09/949,414

(22) Filed: Sep. 5, 2001

(65) Prior Publication Data

US 2003/0050724 A1 Mar. 13, 2003

(51) Int. Cl.$^7$ ................... H01L 21/31; H01L 21/469
(52) U.S. Cl. ............... 438/788; 438/783; 438/784; 427/579
(58) Field of Search ............... 438/788, 778, 438/783, 784; 427/579, 578

(56) References Cited

U.S. PATENT DOCUMENTS

| | | | |
|---|---|---|---|
| 5,563,105 A | 10/1996 | Dobuzinsky et al. | |
| 5,571,576 A | 11/1996 | Qian et al. | |
| 5,661,093 A | 8/1997 | Ravi et al. | |
| 5,811,356 A | * 9/1998 | Murugesh et al. | 438/711 |
| 5,937,323 A | 8/1999 | Orczyk et al. | |
| 6,383,954 B1 | 5/2002 | Wang et al. | |
| 6,468,927 B1 | * 10/2002 | Zhang et al. | 438/779 |
| 6,541,400 B1 | 4/2003 | Tian et al. | |
| 2003/0049388 A1 | * 3/2003 | Cho et al. | 427/569 |

FOREIGN PATENT DOCUMENTS

| | | |
|---|---|---|
| EP | 0 822 585 | 4/1998 |
| WO | WO 92/20833 | 11/1992 |

OTHER PUBLICATIONS

Shapiro, M.J., et al., "Dual Frequency Plasma CVD Fluorosilicate Glass Water Absorption and Stability," DUMIC Conference; Feb. 1995, pp. 118–123.

Hayasaka N., et al., "High–Quality and Low Dielectric Constant SiO2 CVD Using High Density Plasma," Dry Processing Symposium, vol. 2, Nov. 1993, pp. 163–168.

Fukada Takashi, et al., "Preparation of SiOF Films With Low Dielectric Constant By ECR Plasma CVD," Japan, DUMIC Conference, Feb. 1995, pp. 43–49.

Usami, Takashi, "Low Dielectric Constant Interlayer Using Fluorine–Doped Silicon Oxide," Japan J. Appl. Phys. vol. 33, Jan. 1994, pp. 408–412.

Laxman, Ravi, "Low e Dielectrics: CVD Fluorinated Silicon Dioxides," Semiconductor International, May 1995, pp. 71–75.

* cited by examiner

*Primary Examiner*—Alexander Ghyka
(74) *Attorney, Agent, or Firm*—Townsend and Townsend and Crew

(57) ABSTRACT

A method is provided for forming a fluorinated silicate glass layer with HDP-CVD having a lower dielectric constant without compromising the mechanical properties of hardness and compressive stress. A gaseous mixture comprising a silicon-containing gas, an oxygen-containing gas, and a fluorine-containing gas is provided to a process chamber. The ratio of the flow rate of the fluorine-containing gas to the flow rate of the silicon-containing gas is greater than 0.65. A high-density plasma is generated from the gaseous mixture by applying a source RF power having a power density less than 12 W/cm$^2$. A bias is applied to a substrate in the process chamber at a bias power density greater than 0.8 W/cm$^2$ and less than 2.4 W/cm$^2$. The fluorinated silicate glass layer is deposited onto the substrate using the high-density plasma.

22 Claims, 15 Drawing Sheets

FIG. 6(a)
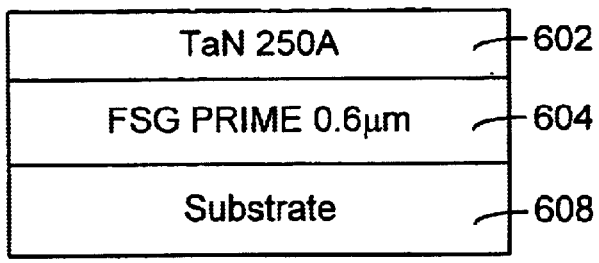
FIG. 6(b)
Post O2 ash
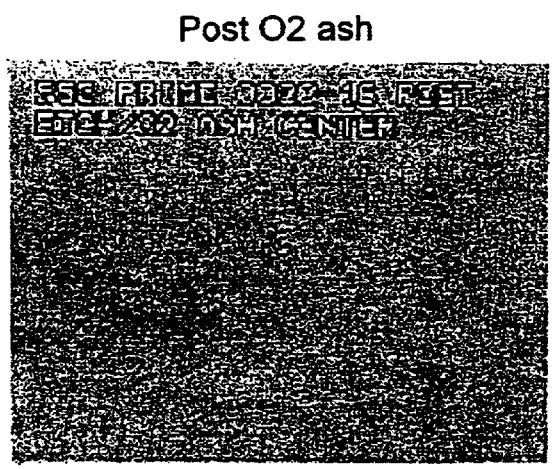
Post TaN deposition and anneal
Ar pre-clean
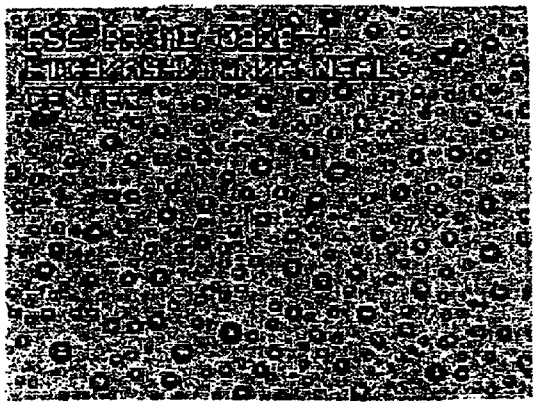
FIG. 6(c)
Reactive H2 pre-clean
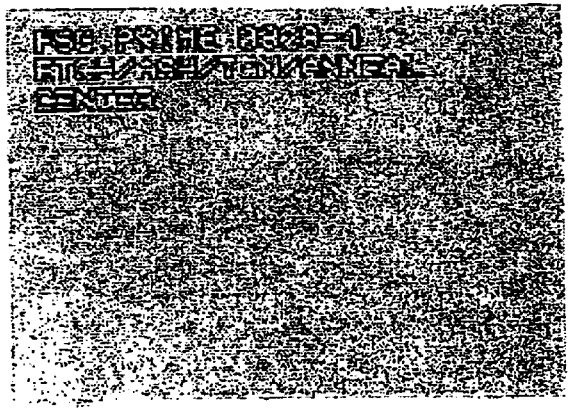
FIG. 6(d)

SiN-1 [H]=12 at.%

FIG. 7(a)

SiN-2 [H]=16 at.%

FIG. 7(b)

SiN-3 [H]=20 at.%

Blistering

FIG. 7(c)

Mag=50x
No Blistering

FIG. 7(d)

Mag=50x
No Blistering

FIG. 7(e)

Mag=50x
No Blistering

FIG. 7(f)

Center

Edge

LOW-BIAS-DEPOSITED HIGH-DENSITY-PLASMA CHEMICAL-VAPOR-DEPOSITION SILICATE GLASS LAYERS

BACKGROUND OF THE INVENTION

In conventional integrated circuit fabrication, circuit elements are formed by etching a pattern of gaps in a layer of metal, which are then filled with a dielectric. As efforts continue to include ever greater levels of integration on semiconductor chips, there has developed a persistent need to make circuit components (such as transistors, capacitors, etc.), smaller, bringing the components closer together, thereby allowing a greater number of components per unit of chip area. Increasing the component density on semiconductor chips results in increased sensitivity of operating speed and power consumption on the dielectric constant k of the material used to insulate the electrically conductive structures. If the dielectric constant is too high, the capacitance between the chip's metal lines becomes too large, creating undesirable cross talk across layers.

Various forms of silicon oxide or silicon-oxide-based glass are commonly used as the insulating material in integrated-circuit fabrication. While silicon oxide has an acceptably low dielectric constant for many applications, a lower dielectric constant is preferable for some applications, such as those involving a high density of circuit components. The lower dielectric constant reduces RC time delays, contributing to an overall improvement in the circuit's operation speed. One method of forming an insulator with a lower dielectric constant than undoped silicate glass ("USG") involves adding fluorine to silicon oxide during a chemical-vapor-deposition ("CVD") process. The presence of the fluorine dopants in the resulting fluorinated silicate glass ("FSG") is known to have the desired lowering effect on dielectric constant.

Another factor to be considered in developing methods for depositing layers with appropriate dielectric constant is that copper, which has lower resistance than conventional aluminum alloys, is poised to take over as the main on-chip conductor for all types of integrated circuits. It is more difficult to etch copper than aluminum and a specialized process, referred to as a "damascene process," has therefore been developed for the fabrication of copper-based integrated circuits. Thus, in damascene processes, dielectric layers are first deposited as an integrated stack, which is then etched to form gaps to be subsequently filled with the conductive material. A barrier layer, which can be overlying or underlying, is commonly included to prevent diffusion of copper into adjacent dielectric layers. Some integrated stacks used in damascene processes also use a layer known as an "etch stop" or "hardmask" to provide for selective etching of the layer. Silicon nitride ($Si_xN_y$) is a material commonly used for such applications, for example when forming vias between layers containing metal lines.

Deposition of USG and FSG layers for both gap-fill and damascene applications has previously been undertaken in high-density plasma ("HDP") CVD systems. In such systems, deposition is accomplished by forming a plasma in a chamber from a mixture of gases containing the necessary elemental constituents of the desired layer. In the case of gap-fill applications, the wafer may be processed in the plasma while a bias is applied to the wafer. The bias accelerates ions from the plasma to the wafer so that the wafer is bombarded material that might prematurely close the gap is sputtered away while material from the plasma simultaneously deposits to fill the gap. The FSG gap-fill process is a generally good process scheme in terms of reliability, stability and throughput. HDP-FSG layers deposited in gap-fill applications have typically had a fluorine concentration of about 5.5–7.0 atomic percent (at. %) and a dielectric constant k of about 3.7, compared to a value of k about 4.0 to 4.3 for conventional undoped silicon oxides.

In addition to a sufficiently low dielectric constant, it is important that the material used for gapfill or damascene applications also have sufficient mechanical properties. For some applications, the material should have a hardness of at least 2.0 GPa and a compressive stress in order to minimize cracking.

Accordingly, it remains desirable to have a material that retains the oxide-like properties of good hardness and compressive stress of FSG while simultaneously having a lower dielectric constant.

SUMMARY OF THE INVENTION

Embodiments of the invention provide a method for forming a fluorinated silicate glass layer with HDP-CVD having a lower dielectric constant without compromising the mechanical properties of hardness and compressive stress. A gaseous mixture comprising a silicon-containing gas, an oxygen-containing gas, and a fluorine-containing gas is provided to a process chamber. The ratio of the flow rate of the fluorine-containing gas to the flow rate of the silicon containing gas is greater than 0.65. In some embodiments, the fluorine-containing gas comprises $SiF_4$. A high-density plasma is generated from the gaseous mixture by applying a source RF power having a power density less than 12 $W/cm^2$. A bias is applied to a substrate in the process chamber at a bias power density greater than 0.8 $W/cm^2$ and less than 2.4 $W/cm^2$. The fluorinated silicate glass layer is deposited onto the substrate using the high-density plasma.

In some embodiments, the stability of the film may be increased by further including a nitrogen-containing gas in the gaseous mixture to deposit a nitrofluorinated silicate glass layer. In other embodiments, phosphorus-containing and boron-containing gases may also be included in the gaseous mixture.

In some embodiments, the fluorinated silicate glass layer is deposited on a silicon nitride barrier layer, which may have a hydrogen concentration less than 20 at. %. Such deposition of the silicon nitride layer and the fluorinated silicate glass layer may form part of a copper damascene process. In certain embodiments, a metal layer, such as TaN, is deposited on the fluorinated silicate glass layer after etching and ashing the silicate glass layer. In a particular embodiment, the ashing is performed with an $O_2$ chemistry. Before depositing the metal layer, the fluorinated silicate glass layer may also be cleaned with reactive $H_2$.

Other deposition parameters may also be varied. In some embodiments, the high-density plasma is generated from the gaseous mixture my applying a source RF power having a power density less than 12 $W/cm^2$ and in other embodiments, the pressure in the process chamber is maintained above 11 mtorr.

The methods of the present invention may be embodied in a computer-readable storage medium having a computer-readable program embodied therein for directing operation of a substrate processing system. Such a system may include a process chamber, a plasma generation system, a substrate holder, a gas delivery system, and a system controller. The computer-readable program includes instructions for operating the substrate processing system to form a thin layer on a substrate disposed in the processing chamber in accordance with the embodiments described above.

A further understanding of the nature and advantages of the present invention may be realized by reference to the remaining portions of the specification and the drawings.

BRIEF DESCRIPTION OF THE DRAWINGS

In the figures, similar components and/or features may have the same reference label. Where reference is made in the detailed description to a figure without specifying a particular subpart, the reference is intended to refer collectively to all subparts of the figure.

FIG. 6(a) is a schematic diagram of a structure used to test integration of FSG prime with TaN;

FIG. 6(b) is an optical microscope view of the FSG prime layer of the structure of FIG. 6(a) after etching and $O_2$ ashing;

FIGS. 6(c) and 6(d) are optical microscope views of the structure of FIG. 6(a) after TaN deposition and annealing: FIG. 6(c) shows a view where an Ar preclean was used and FIG. 6(d) shows a view where a reactive $H_2$ preclean was used;

FIGS. 7(a)–7(f) are optical microscope views of an FSG prime layer deposited an SiN with varying H concentrations;

DESCRIPTION OF THE SPECIFIC EMBODIMENTS

I. Introduction

Embodiments of the invention provide a method for forming a silicate glass layer with HDP-CVD having a lower dielectric constant without compromising the mechanical properties of hardness and compressive stress. The process includes maintaining an RF bias power density below 2.4 W/cm$^2$, particularly in the range of 0.8–2.4 W/cm$^2$. Such an RF bias power density is lower than the typical range of 5–12 W/cm$^2$ thought to be desirable for adequate deposition. In one embodiment, the silicate glass layer is fluorinated so that an FSG layer is provided having a dielectric constant as low as 3.20 as measured by a MOS capacitor method. The stress of this FSG layer is at the same time kept within the range of (2–3)×10$^8$ dynes/cm$^2$. The refractive index is 1.400. This low refractive index is a further indication of the low-k properties of the layer since the majority of other FSG process have a refractive index greater than 1.42. Furthermore, the layer has a good hardness and elastic modulus of 4.2 and 27 GPa. Such an FSG layer produced according to embodiments of the invention is referred to herein as "FSG prime."

II. Exemplary Substrate Processing System

Figure 1A:
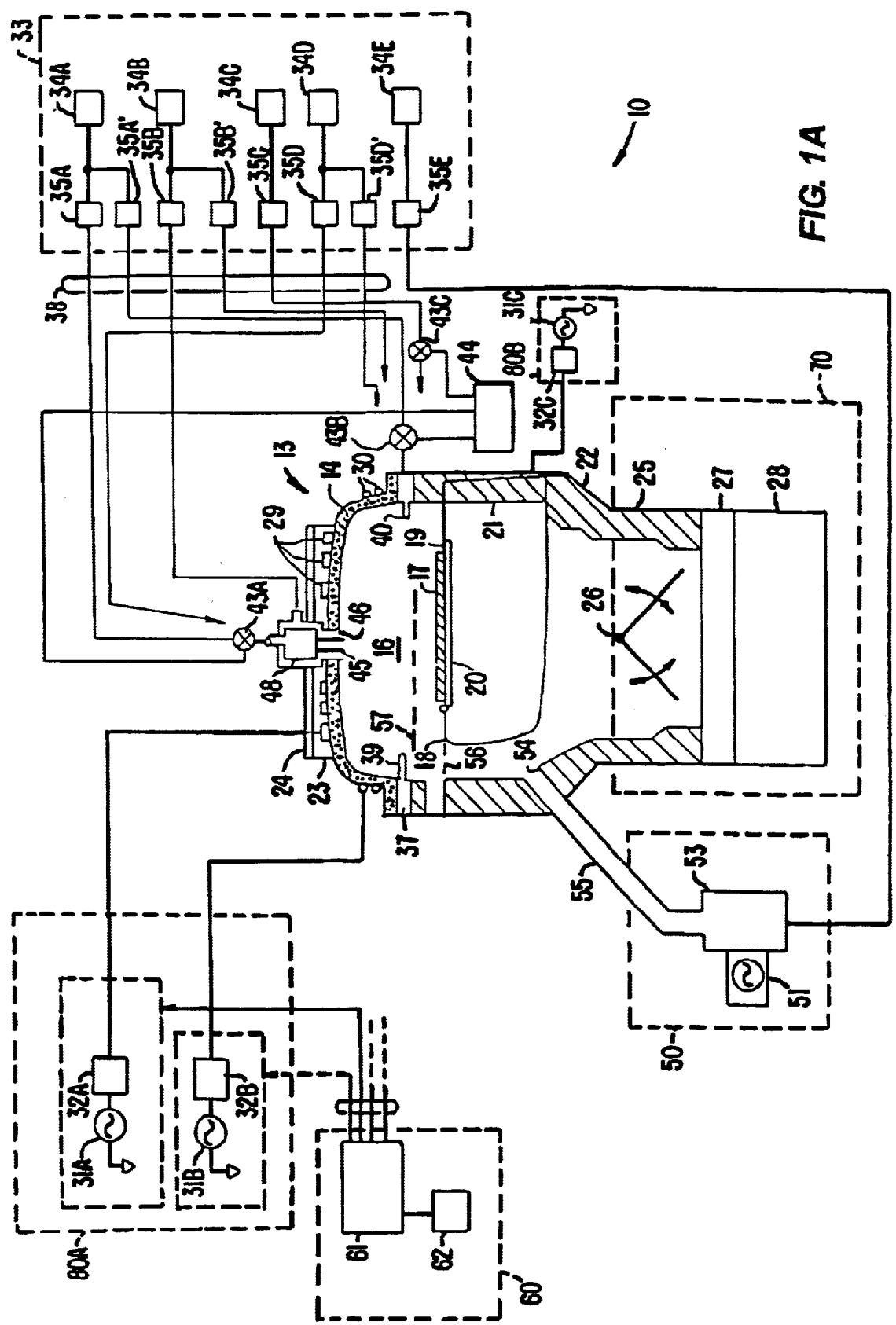
FIG. 1A is a simplified diagram of one embodiment of a high-density plasma chemical vapor deposition system according to the present invention.

FIG. 1A illustrates one embodiment of a high density plasma chemical vapor deposition (HDP-CVD) system 10 in which a substrate can be processed according to the present invention. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (shown in FIG. 2) are raised and then lowered under the control of a motor (not shown) to move the substrate to different positions within the chamber 13. The lift pins may be configured to move the substrate from the robot blade at an upper loading position 57 to a pre-processing position 58 where, as explained further below, the substrate is prepared for processing. Subsequently, the lift pins may move the substrate to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 5,000 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF ("BRF") generator 31 C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
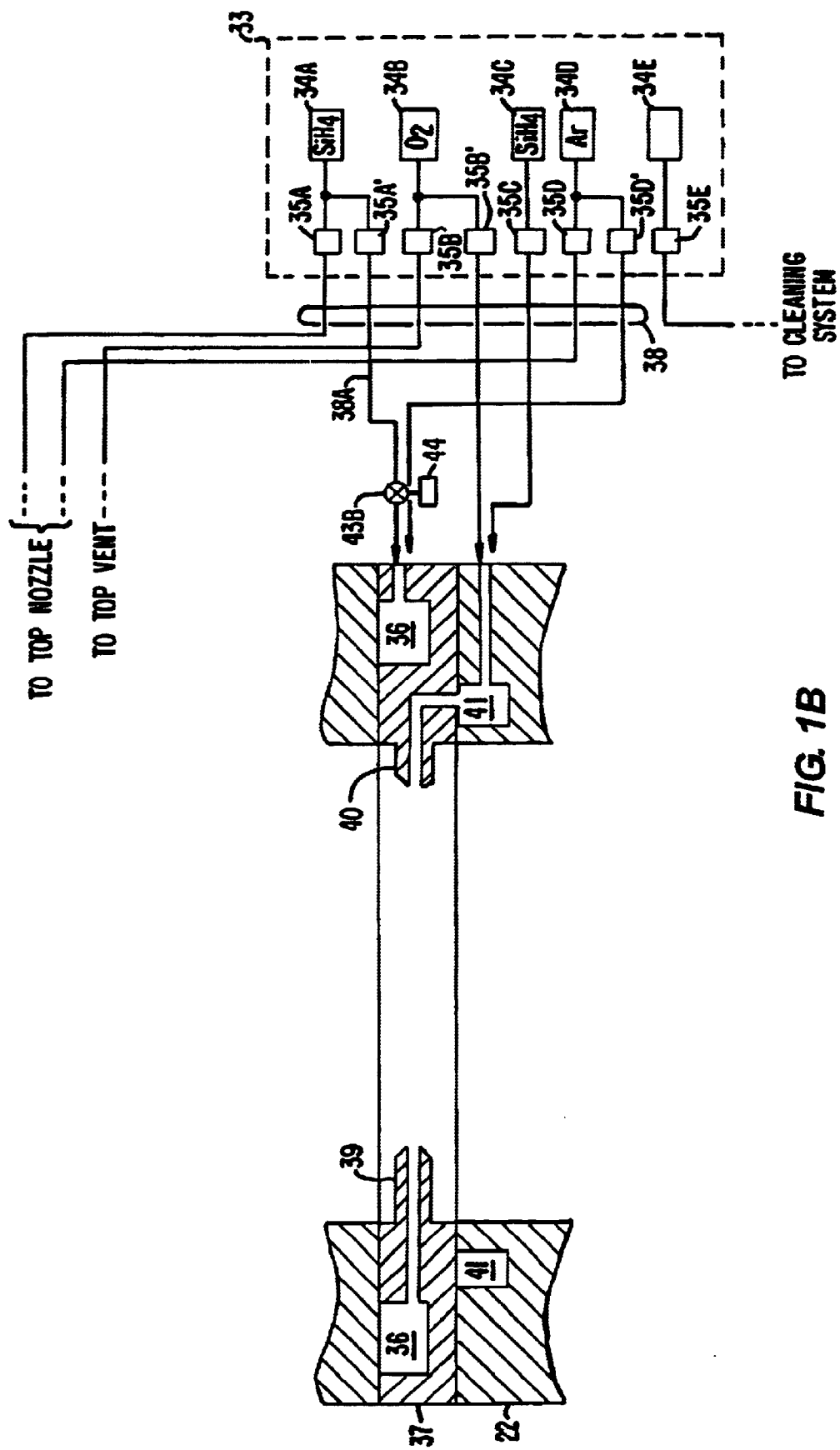
FIG. 1B is a simplified cross section of a gas ring that may be used in conjunction with the exemplary CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves layer uniformity and allows fine adjustment of the layer's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process. In one embodiment, this cleaning system is used to dissociate atoms of the etchant gas remotely, which are then supplied to the process chamber 13. In another embodiment, the etchant gas is provided directly to the process chamber 13. In still a further embodiment, multiple process chambers are used, with deposition and etching steps being performed in separate chambers.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 65, and a light pen 66, as depicted in FIG. 1C.

Figure 1C:
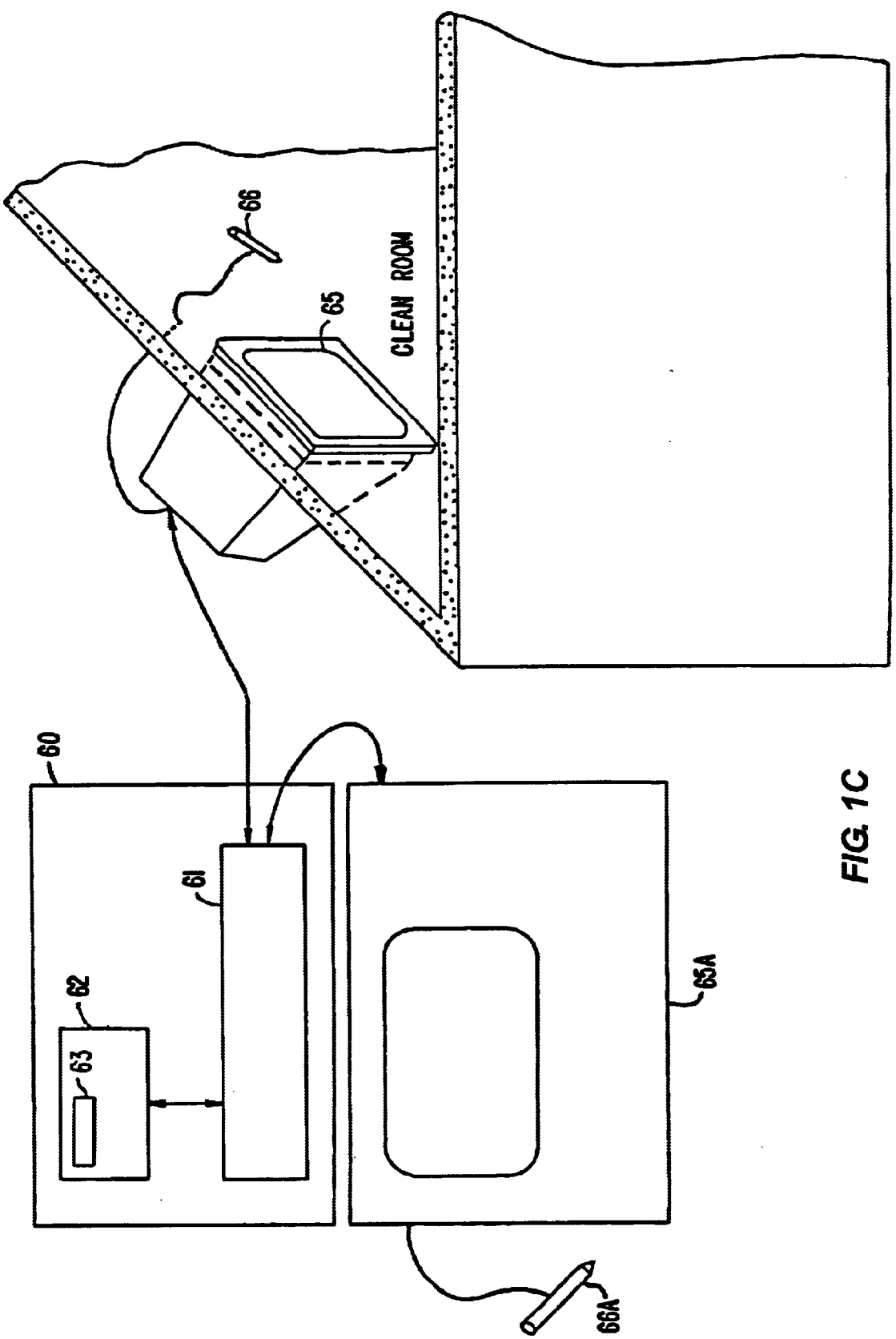
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
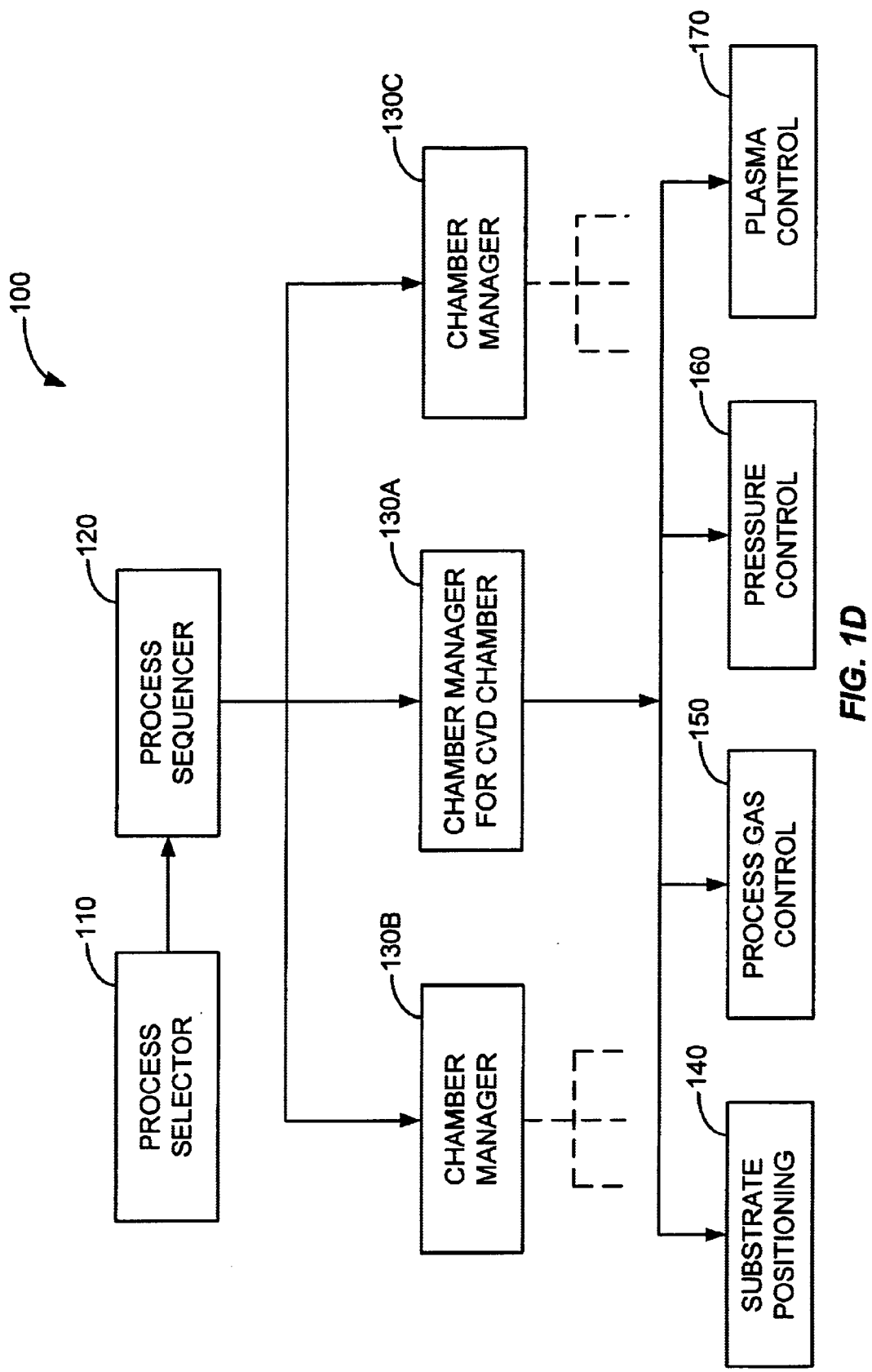
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 140, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a plasma-enhanced CVD ("PECVD") reactor or other reactor in the multichamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in the commonly assigned U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. Exemplary Structures

Figure 2:
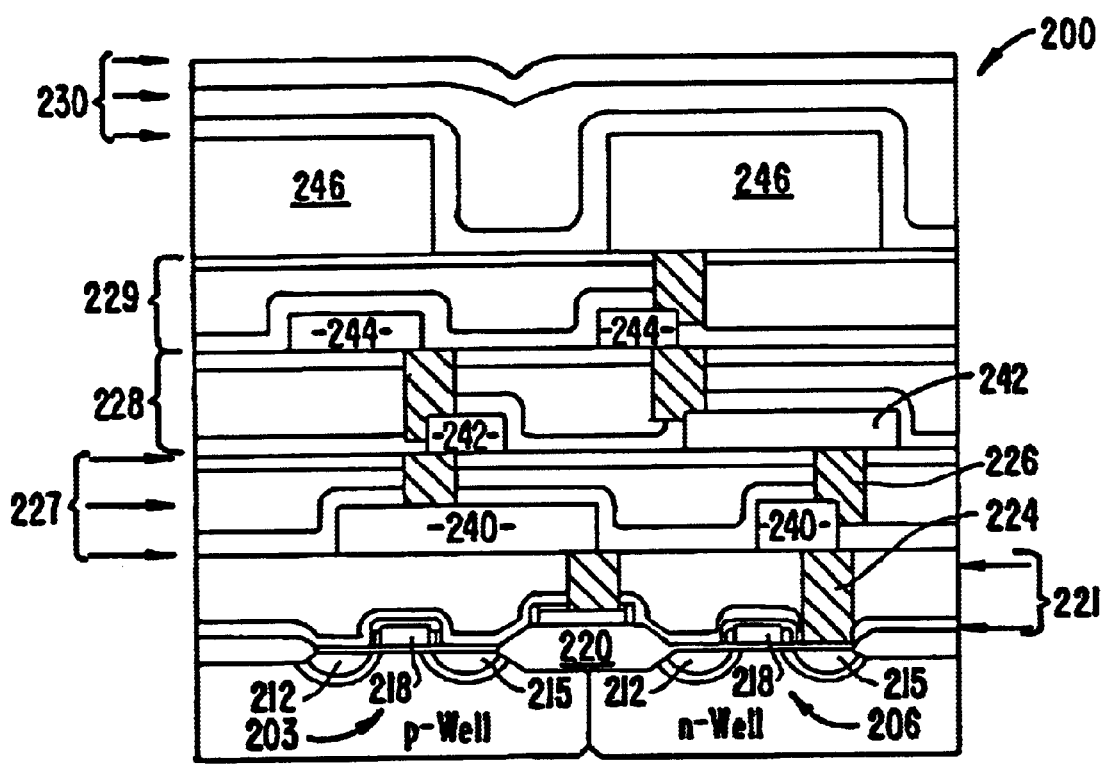
FIG. 2 is a simplified cross-sectional view of a semiconductor device manufactured according to the method of the present invention.

FIG. 2 illustrates a simplified cross-sectional view of an integrated circuit 200, which may be made in accordance with use of the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by a groove trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, and 246 is separated from adjacent metal layers by respective intermetal dielectric (IMD) layers 227, 228, or 229. Any or all of IMD layers 227, 228, or 229 can be deposited in accordance with embodiments of the present invention. Adjacent metal layers are connected at selected openings by vias 226. Deposited over metal layer 246 are planarized passivation layers 230.

It should be understood that simplified integrated circuit 200 is for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to PMOS, NMOS, CMOS, bipolar, or BiCMOS devices.

IV. Exemplary Damascene Process

Figure 3A:
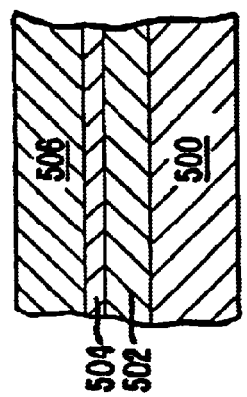
FIGS. 3(a)–3(h) depict a cross-section of a partially formed integrated circuit undergoing an integrated dual-damascene process according to an embodiment of the present invention.
Figure 3B:
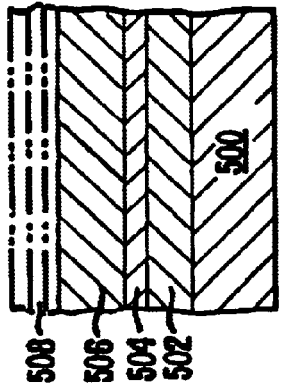
Figure 3C:
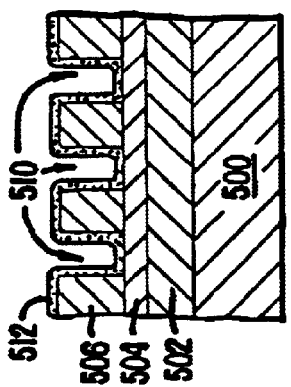

An example of a dual-damascene process integration scheme that uses the silicate-glass layer deposition of the present invention in forming an IMD layer is depicted in FIGS. 3(a)–3(h). The dual damascene process begins with the deposition of an oxide layer 502 over a silicon substrate 500 as shown in FIG. 3(a). A barrier layer 504 is deposited over oxide layer 502, e.g., by HDP-CVD using $SiH_4$ and $N_2$ or PECVD using $SiH_4+NH_3/N_2$. In some applications layer 504 acts as a hardmask or etch-stop layer. A first silicate-glass layer 506 is deposited, e.g., using the HDP-CVD method described above. First silicate-glass layer 506 may be deposited in the same chamber as barrier layer 504 to enhance process integration. A first patterned photoresist layer 508 covers silicate-glass layer 506 during a first photolithography as shown in FIG. 3(b). A first etch forms a first set of gaps 510 in first silicate-glass layer 506 down to hardmask layer 504 as shown in FIG. 3(c).

Figure 3D:
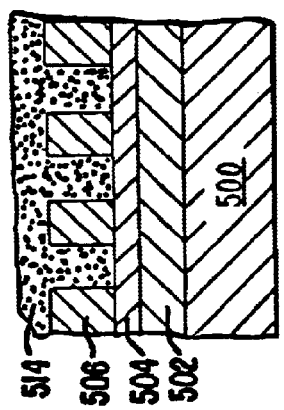

After the first etch, photoresist 508 is stripped, e.g., by ashing in an oxidizing environment. Gaps 510 and first silicate-glass layer 506 are then covered with a layer of metal, such as aluminum or copper. In the case of copper, a seed layer 512 (FIG. 3(c)) is deposited over gaps 510 and first silicate-glass layer 506. A first bulk copper layer 514 is deposited to fill the gaps 510 as shown in FIG. 3(d). In some applications, a barrier layer (not shown) is deposited over first silicate-glass layer 506 and gaps 510 prior to deposition of seed layer 512. The barrier layer prevents interdiffusion of copper and the silicate glass. Copper layer 514 is planarized, e.g., by chemical and mechanical polishing (CMP). Planarization of copper layer 514 forms, e.g., a first set of metal lines 515 in an interconnect structure.

Figure 3E:
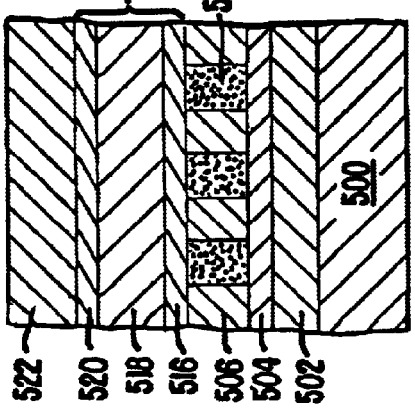
Figure 3F:
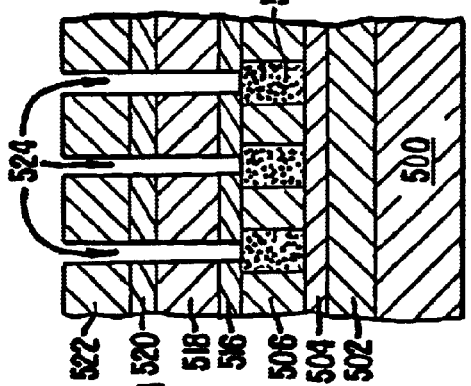
Figure 3G:
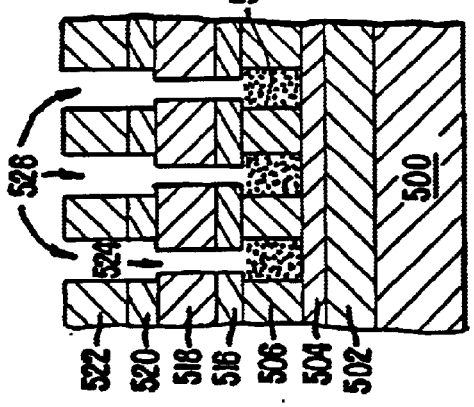
Figure 3H:
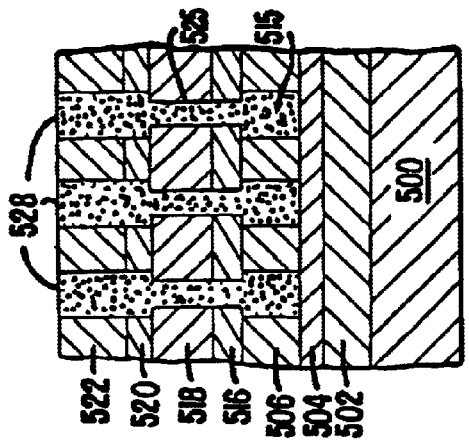

After planarization, of copper layer 514, a second barrier layer 516, a second silicate-glass layer 518, a third barrier layer 520 and third silicate-glass layer 522 are deposited to form an IMD layer 521 as shown in FIG. 3(e). Second silicate-glass layer 518 and third silicate-glass layer 522 may be deposited by HDP-CVD as described above. Layers 518, 520, and 522 may be deposited in the same chamber, e.g., by HDP-CVD, without removing substrate 500 to enhance process integration for forming IMD layer 521. To prevent oxidation of copper layer 514 and contamination of the chamber, substrate 500 may be heated in a high-density Argon plasma without oxygen prior to depositing second silicate-glass layer 518. A second lithography and etch forms vias 524 through layers 516, 518, 520 and 522 down to copper layer 514 as shown in FIG. 3(f). In FIG. 3(g), a third lithography and etch forms a second set of gaps 526. Gaps 526 define a second set of metal lines and vias 524 define a set of interconnects between the second set of metal lines and the first set of metal lines defined by gaps 510 and copper layer 514. Vias 524 and gaps 526 are then filled with a second bulk copper layer and the resulting structure is annealed and planarized as shown in FIG. 3(h). Gaps 526 define a second set of metal lines 528 and vias 524 define a set of interconnects 525 between the second set of metal lines 528 and the first set of metal lines 515.

Damascene processes are used in devices that use copper interconnects because there is currently no acceptable way to etch copper. Structures formed by damascene processes do not require a gap-fill dielectric and generally provide lower RC delays than similar structures formed using metal lines aluminum, tungsten, titanium or other metals. Furthermore, higher deposition rates may be used in damascene processes since gap-fill is not an issue. Any of barrier layers 506, 516 and 520 can be silicon nitride layers. Alternatively, it may be desirable to deposit one or more of barrier layers 506, 516 and 520 as silicon-carbon low-k barrier layers such as BLOK™ (Barrier Low K). BLOK™ is a trademark of Applied Materials, Inc. of Santa Clara, Calif.

V. Parameters for Silicate-Glass Deposition a. Properties of Undoped Silicate Glass (USG)

Figure 4A:
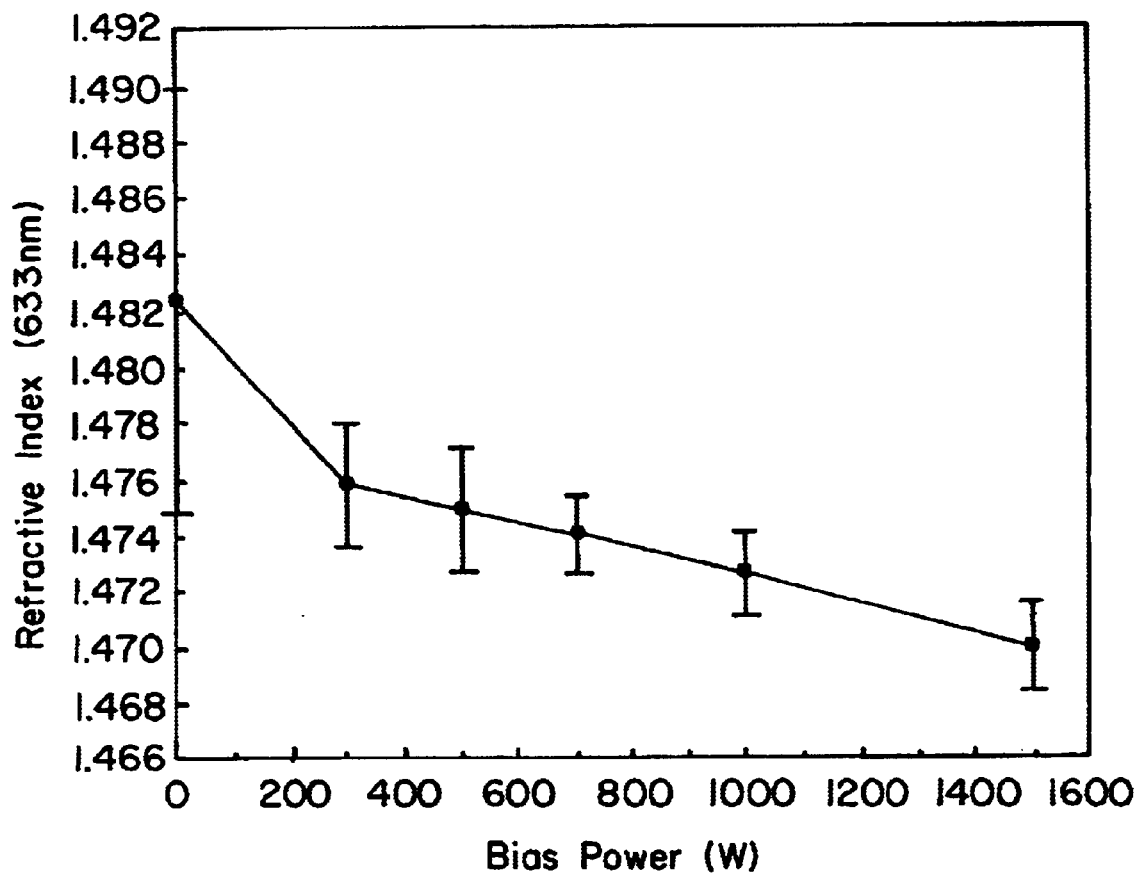
FIG. 4(a) shows the dependence of refractive index on RF bias power for an undoped silicate glass layer.
Figure 4B:
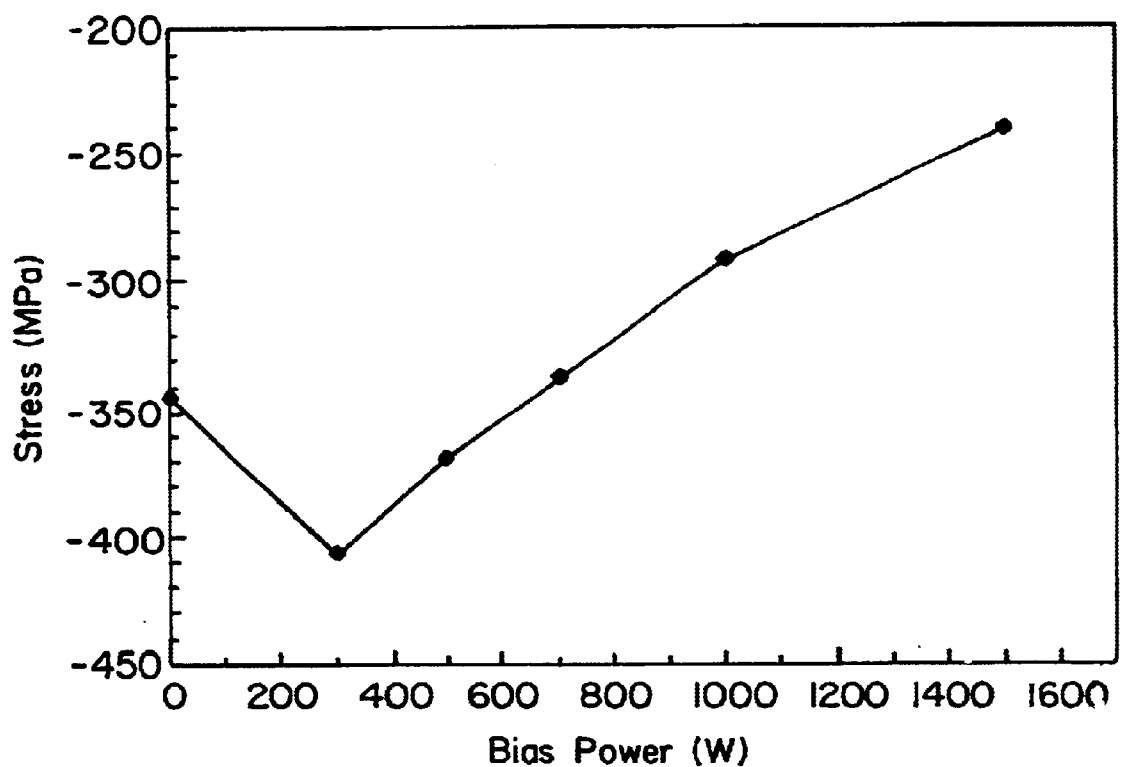
FIG. 4(b) shows the dependence of stress on RF bias power for an undoped silicate glass layer.
Figure 4C:
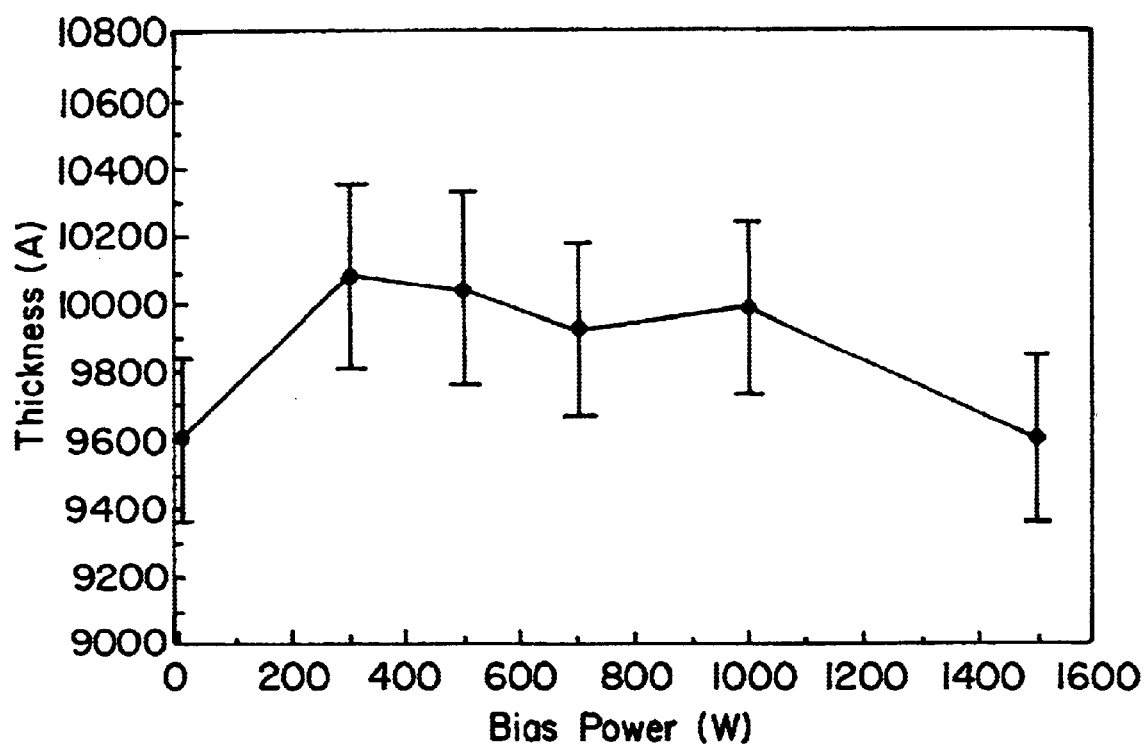
FIG. 4(c) shows the dependence of thickness on RF bias power for an undoped silicate glass layer.

FIGS. 4(a)–4(c) show the specific effect of RF bias power on refractive index, stress, and deposition rate of undoped silicate glass (USG), i.e. using a silane such as $SiH_4$ and $O_2$ as precursors, but without, for example, any $SiF_4$ precursor, in HDP-CVD deposition. All of the data were generated for a 200-mm wafer at a chamber pressure of 13 mtorr, at a constant temperature of 430° C. using wafer temperature control, and with a top source RF power of 1300 W and a side source RF power of 3100 W. Conclusions regarding properties attributable to the RF bias power density apply to any wafer size, including 100-mm and 300-mm wafers.

FIG. 4(a) shows the refractive index of USG deposited with an RF bias power up to 1600 W, corresponding to an RF bias power density up to about 5 $W/cm^2$. FIG. 4(b) shows the stress over the same bias power range. FIG. 4(c) illustrates the deposition rate over the same bias power range by plotting the layer thickness for a fixed deposition time. FIG. 4(a) shows that at zero bias, the refractive index is high, indicating that the deposited oxide layer is silicon-rich. The existence of an oxygen-deficient process is confirmed with the results at zero bias in FIGS. 4(b) and 4(c), where the layer thickness is lower and the stress less compressive at zero bias than at 300 W.

The stress measurements shown in FIG. 4(b) have a standard deviation of 5% and exhibit a V-shaped profile in at least the range of about 250–550 W, which corresponds to an RF bias power density of about 0.8–1.8 $W/cm^2$. In the region from 0 to about 300 W, the stress becomes more compressive because of the higher oxygen content. This stress behavior is consistent with the decrease in refractive index and increase in deposition rate, both of which are also indicative of higher oxygen incorporation. This means that when there is no bias, the HDP-CVD process is oxygen-deficient, i.e. is silicon rich.

When the RF bias power exceeds 300W, the stress decreases and becomes less compressive. It takes about an additional 300 W of RF bias power over the minimum near 300 W for the stress to recover to its original value at zero bias, causing the approximately symmetric V-shaped behavior. The decrease in stress is not due to the layer becoming silicon-rich since the refractive index in FIG. 4(a) does not increase. Instead the refractive index remains constant in the range between about 300 W and 700 W. This is confirmed by an approximately constant deposition rate over the same range. There is thus generally a range in RF bias power density in HDP-CVD processes where the refractive index and deposition rate are approximately constant. The decrease in stress over this range is therefore attributed to an increase in the breakage of Si—O bonds resulting from the increase in bias power density. Above about 1000 W, however, the bias is sufficiently high that species begin to sputter, with a concomitant decrease in deposition rate as shown in FIG. 4(c).

The inventors have accordingly discovered a particular RF bias power density window between 0.8 and 2.4 $W/cm^2$ in HDP-CVD processes that provides stable layer properties, such as stress, and which applies independently of the precursor gases. This window is at a lower power density than the otherwise typical RF bias power density of about 11 $W/cm^2$ used in HDP-CVD processes. It is believed that the existence of the window arises from the fact that the lower RF bias power density permits reduced ion bombardment, making the silicate glass layer form more densely. The lower limit of the window reflects the fact that some bombardment is nevertheless desirable to have sufficient ion mobility in forming the layer. At least some level of RF bias power is also desirable to provide better temperature control during deposition of the layer. The effect of such a window may be exploited for the deposition of undoped silicate glass, fluorinated silicate glass, nitrofluorinated silicate glass, phosphosilicate glass, borophosphosilicate glass, germanium-doped silicate glass, SiON, or silicon nitride, among others.

b. Dielectric Constant of Fluorinated Silicate Glass (FSG)

As a particular example, the results of tests evaluating the effect of various parameters on both stress and dielectric constant for fluorinated silicate glass (FSG) are summarized in FIGS. 5(a)–5(d). A layer of FSG was deposited by the method described above on a 200-mm wafer using $SiF_4$ as a precursor. The results of stress measurements are presented with diamond data points corresponding to the left scale and the dielectric-constant results are presented with squares corresponding to the right scale. For each of the results presented in FIGS. 5(a)–5(d), the dielectric constant was determined with a mercury-probe measurement. While it is known that mercury-probe measurements systematically overestimate the more accurate MOS-capacitor measurements by ~0.15, they illustrate the overall trend. The mercury-probe technique provides an overestimate because it is sensitive to the surface tension between the mercury and the surface measured, and the surface tension is in turn affected by the fluorine doping. The figures also exhibit the general trend that stress is correlated with dielectric constant, so that as the dielectric constant of the FSG layer decreases, the stress tends to become less compressive.

Figure 5A:
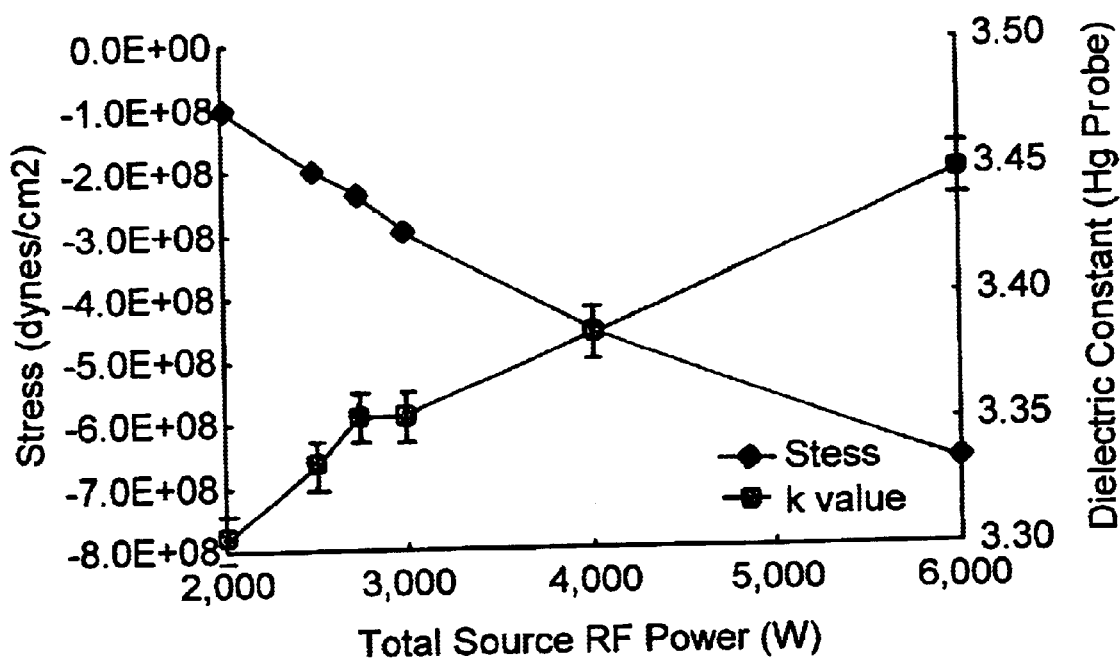
FIG. 5(a) shows the dependence of stress and dielectric constant on total source RF power for a fluorinated silicate glass layer.
Figure 5B:
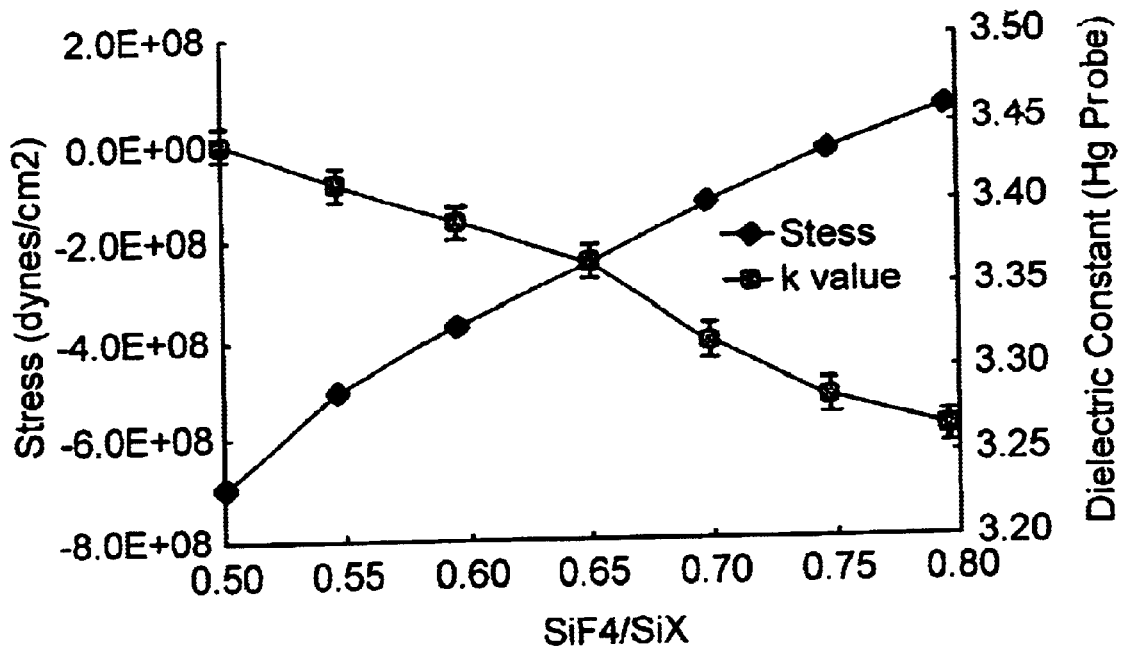
FIG. 5(b) shows the dependence of stress and dielectric constant on the ratio of $SiF_4$ to silanes for a fluorinated silicate glass layer.
Figure 5C:
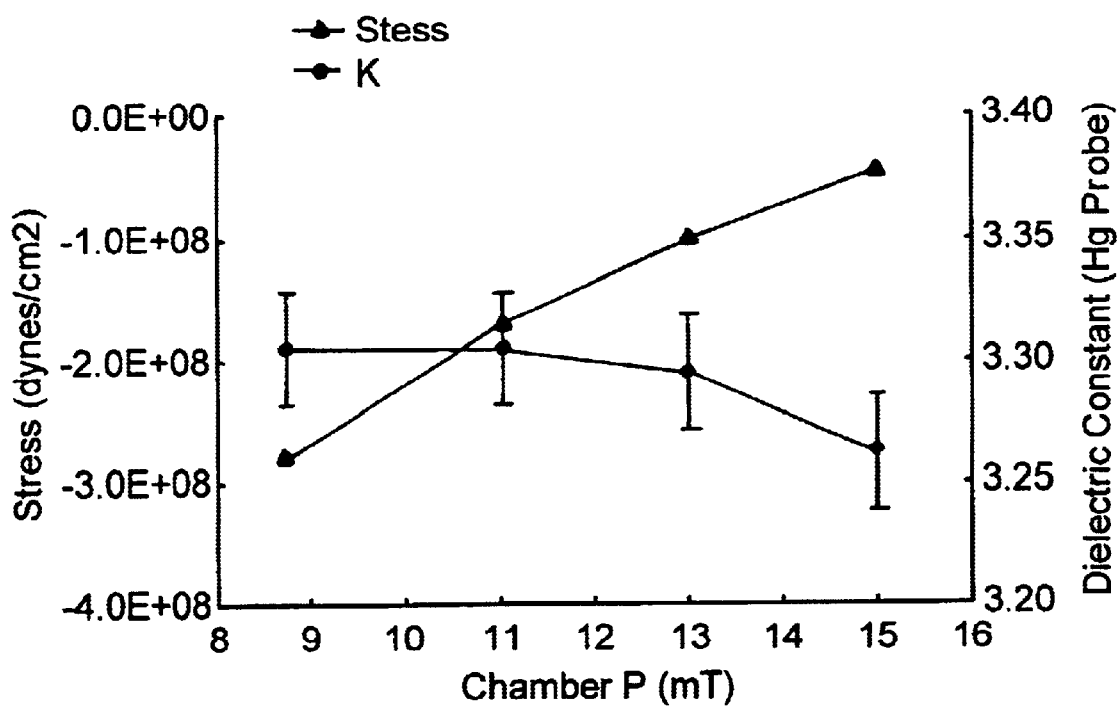
FIG. 5(c) shows the dependence of stress and dielectric constant on chamber pressure for a fluorinated silicate glass layer.

The measurements for FIGS. 5(a)–5(c) were all performed for an RF bias power of approximately 500 W, corresponding to a power density of approximately 1.6 $W/cm^2$. FIG. 5(a) shows the dependence of stress and dielectric constant on the source RF power between 2000 and 6000 W, corresponding to a source RF power density between about 6 and 19 $W/cm^2$. The dielectric constant decreases, and the stress becomes less compressive, with a decrease in the source RF power. Similar results are presented in FIG. 5(b), which show the dependence of stress and dielectric constant on the relative concentration of $SiF_4$ to silicon-containing gases such as silanes. Over the exhibited range of 0.50 to 0.80, an increase in the ratio $[SiF_4]/[SiX]$, corresponding to an increase in the fluorine concentration of the resulting FSG layer, is correlated with a decrease in the dielectric constant. FIG. 5(c) shows the dependence of stress and dielectric constant on the chamber pressure between 8 and 16 mtorr. The dependence is somewhat weaker, but an increase in pressure, such as above 11 mtorr, also results in a decrease in the dielectric constant. The effect of pressure variations may also be reproduced by changing residence time, a higher pressure being correlated with lower residence time.

Figure 5D:
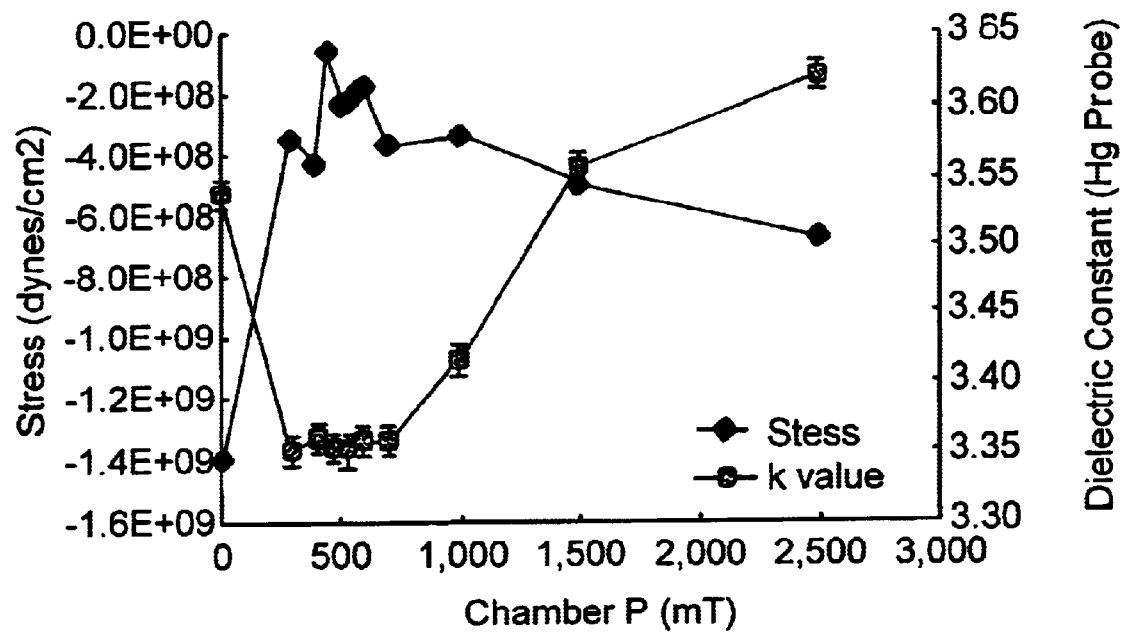
FIG. 5(d) shows the dependence of stress and dielectric constant on RF bias power for a fluorinated silicate glass layer.

Of particular note are the results shown in FIG. 5(d) in which the effect of bias RF power is examined up to 3000

W, corresponding to a bias RF power density up to about 10 W/cm². Of particular note is the plateau in the dielectric constant at about k=3.35 between about 250 and 750 W. This plateau corresponds to a range of bias power density of 0.8–2.4 W/cm² and is exploited in embodiments of the invention to produce the FSG prime layer. According to the results presented in FIGS. 5(a)–5(c), a decreased dielectric constant may be obtained with a combination of low source RF power density, high [SiF$_4$]/[SiX] ratio, high chamber pressure. This is, however, subject to the proviso that the mechanical properties of the resulting layer be adequate.

It had previously been the case that the combination of a dielectric constant as low as 3.35 with such mechanical properties could not be achieved. In particular, previous efforts to produce a film with such a low dielectric constant resulted in materials having a tensile stress. It was thus unexpected that the particular combination of conditions discovered by the inventors could lead to a film simultaneously having a low dielectric constant and a compressive stress. FIG. 5(d) provides an experimental demonstration that it is, despite prior expectations, possible to achieve such a low dielectric constant by keeping the RF power density in the range 0.8–2.4 W/cm², without compromising the mechanical properties of the layer.

c. Integration of Fluorinated Silicate Glass

For an FSG layer to be successfully integrated with damascene process flow, the layer must withstand etch and ashing processes, and also be compatible with a metal barrier such as TaN. Additional tests were therefore performed to evaluate the integration and adhesion of a layer of FSG formed with the RF bias power density in the range 0.8–2.4 W/cm² ("FSG prime") and are summarized in FIGS. 6(a)–6(d), which are directed to an experiment in which the integration of FSG prime with TaN was tested. A 1.0-μm layer of FSG prime was deposited on a substrate and subsequently etched and ashed to remove 0.4 μm of the layer. Three different ash chemistries, O$_2$, NH$_3$/O$_2$, and NH$_3$, were tested. Subsequently, the layer was solvent cleaned and the chamber degassed. Two degas powers were tested: a "low-power" degas used 60% power for 20 s followed by 40% power for 20 s and a "high-power" degas used 80% power for 20 s followed by 60% power for 20 s. The degas was followed by a physical-vapor-deposition preclean using an Ar sputter or reactive H$_2$. A 250-Å layer of TaN was deposited on the layer, which was then also annealed at 425° C. for two hours in order to simulate the thermal budget for these structures during subsequent processing.

The resulting sandwich structure is shown schematically in FIG. 6(a) and includes a 0.6-μm FSG prime layer 604 between the TaN layer 602 and the substrate. The stability of the structure was determined using confocal microscopic techniques. FIG. 6(b) shows a 500×optical microscope view of the FSG prime layer after etching with an O$_2$ ash. FIGS. 6(c) and 6(d) show a 500×optical microscope view after deposition and annealing of the TaN layer respectively for an Ar preclean and a reactive H$_2$ preclean, with bubbling being evident with the Ar preclean. The results of the investigation may be summarized: (i) superior performance for TaN adhesion is achieved with O$_2$ ash; (ii) the reactive H$_2$ preclean is more robust than the Ar preclean; and (iii) the high-power degas provides better results than the low-power degas when the Ar preclean is used.

FIGS. 7(a)–7(f) show the results of a blanket wafer study testing the adhesion of FSG prime to SiN. Experiments were performed in which a 10-kÅ layer of FSG prime underwent Cu chemical mechanical polishing (CMP) using Applied Materials' Mira™ system, followed by an in situ NH$_3$ treatment at 350° C. A 2-kÅ layer of SiN was then deposited and the structure annealed at 425° C. for two hours in a N$_2$ atmosphere. The SiN deposition was performed for three different H concentrations, 12 at. % ("SiN-1"), 16 at. % ("SiN-2"), and 20 at. % ("SiN-3"). FIGS. 7(a)–7(c) show 50×optical microscope views of the center of the structure for each of the three different H concentrations and FIGS. 7(d)–7(f) similarly show 50×optical microscope views of the edge of the structure for the three H concentrations. No significant blistering is observed for the SiN-1 and SiN-2 cases, although some blistering is evident when the H concentration reaches 20 at. %. The adhesion of SiN to FSG prime is thus improved with a lower H content.

FIGS. 8(a)–8(e) show further results investigating the integration of FSG prime with SiN in a single-level damascene configuration. The structure shown in FIG. 8(a) was formed by beginning with ultraflat wafers having a resistivity ρ=10–25 Ωcm. Plasma-enhanced deposition was used to deposit a 10-kÅ layer of USG 802, followed by a 2-kÅ layer of SiN 804. Subsequently a 1.5-μm layer of FSG prime 806 was deposited with HDP CVD according to the method of the invention. Lithography and etching was performed on the FSG prime layer to form 6-kÅ-deep trenches, which were subsequently filled with Cu 810 after a solvent clean. The structure was polished by Cu CMP with Applied Materials' Mirra® system. A final 2-kÅ layer of SiN 808 was then deposited on the structure, which was then annealed at 350° C. for two hours and at 400° C. for two hours. Deposition of the overlaying SiN layer 808 was performed for the three different H concentrations defined by SiN-1, SiN-2, and SiN-3, both with and without in situ NH$_3$ treatment prior to their deposition.

Figure 8A:
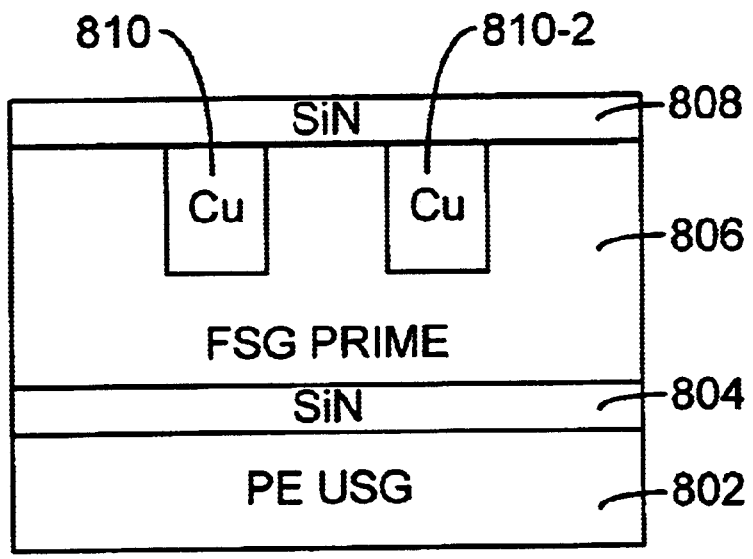
FIG. 8(a) is a schematic diagram of a damascene structure used to test integration of FSG prime with SiN.
Figure 8B:
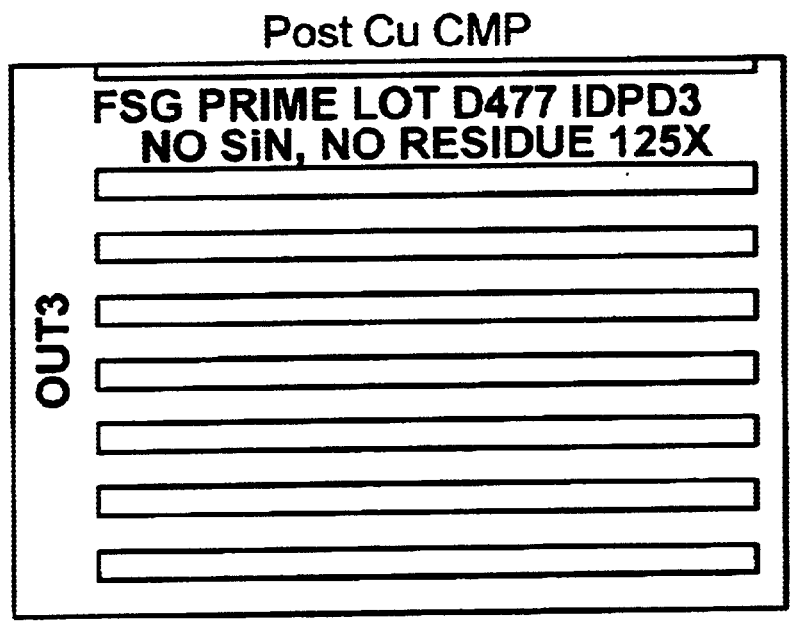
FIG. 8(b) is an optical microscope view of the structure of FIG. 8(a) before deposition of the top SiN layer.
Figure 8C:
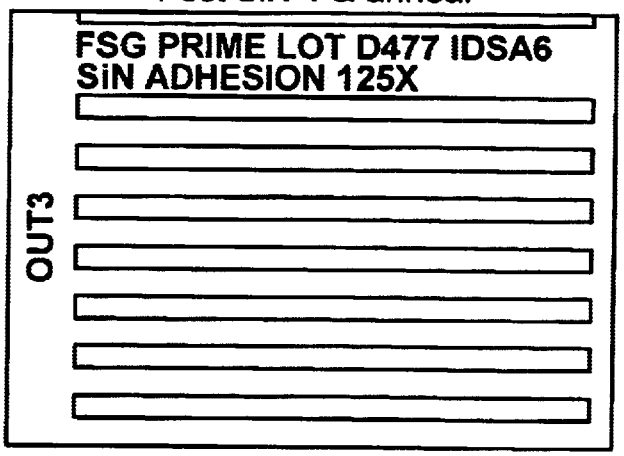
FIGS. 8(c)–8(e) are optical microscope views of the structure of FIG. 8(a) for various H concentrations.
Figure 8D:
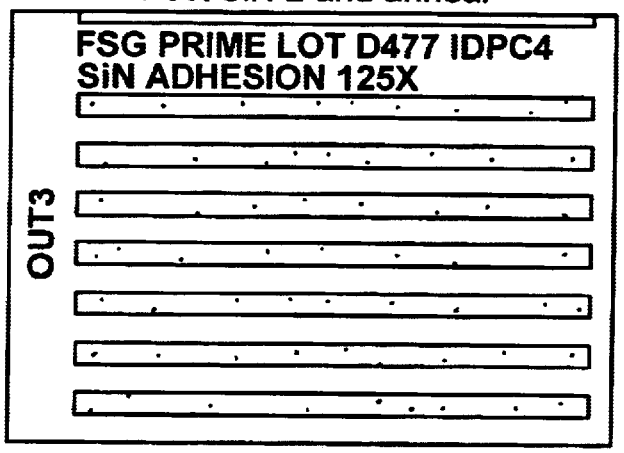
Figure 8E:
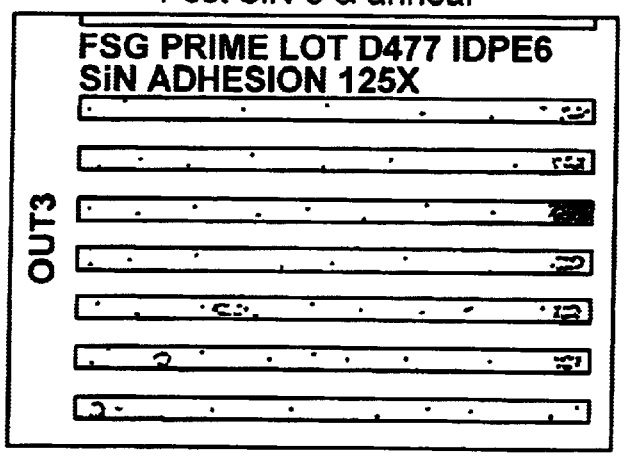

FIG. 8(b) shows a 125×optical microscope view of the structure after the Cu CMP step, showing no significant residue. FIGS. 8(c)–8(e) each show optical microscope views at 125×power after deposition of the overlying SiN layer 808 and annealing, for each of the three H concentrations. No significant effect on adhesion of FSG prime to SiN was found from the in situ NH$_3$ treatment. The results are consistent with those of FIGS. 7(a)–7(f) and show no blistering except when the H concentration reaches 20 at. %.

The results of various experiments and integration studies to define the properties of the FSG prime films deposited in these tests are provided in the following table. It is noted that the stability of the layer may be further improved by additionally doping with nitrogen.

| Parameter | | Performance |
|---|---|---|
| Dielectric | MOS structure | 3.2 |
| constant | Hg Probe | 3.35 |
| Deposition Rate | | 4250 Å/min |
| Deposition Uniformity (1σ, 3mmEE) | | <2.5% |
| Stress (10-kÅ layer) | | −(2 −3) × 10$^8$ dynes/cm² |
| Stress Hysteresis (to 500° C.) | | <5 × 10$^7$ dynes/cm² |
| Refractive Index | | 1.400 |
| Composition | Si | 30.5 at. % |
| (Rutherford | O | 57 at. % |
| Backscattering) | F | 12 at. % |
| | H | 0.5 at. % |
| | N | <10.1 at. % |
| Fluorine Concentration (Fourier-Transform Infrared Si-F/Si-O Peak Height Ratio) | | 7.8–7.9 |
| Fluorine Uniformity (1σ, 3mEE) | | <1.5% |
| Wet Etch Rate Ratio (6:1 Basis of Estimate) | | 7.9 |

-continued

| Parameter | Performance |
|---|---|
| Wet Etch Rate Ratio Uniformity (1σ, 3mmEE) | <3.5% |
| Hardness (2-μm layer) | 4.2 GPa |
| Elastic Modulus (2-μm layer) | 27 GPa |
| Surface Roughness (RMS/$R_{max}$) | 2Å/10Å |
| Leakage Current at 1 MV | <2 × $10^{[8}$ Å/cm$^2$ |
| Breakdown Voltage | 9 MV/cm |
| Layer Density (2-μm layer, microbalance) | 2.16 g/cm$^3$ |
| Moisture Absorption (85-85 test, 17 hours) | Pass |
| Ash Performance | Pass |
| Adhesion to SiN, post CMP (single-level damascene) | Pass for [H] ≤ 16 at. % |
| Adhesion to TaN | Pass for reactive $H_2$ preclean |
| Metallic Ion Contamination  Fe | <5 × $10^{10}$ atoms/cm$^2$ |
|  Ni | <5 × $10^{10}$ atoms/cm$^2$ |
|  Cr | <1 × $10^{10}$ atoms/cm$^2$ |
|  Al | <3 × $10^{10}$ atoms/cm$^2$ |
| Mobile Ion Contamination  Na | 5 × $10^{10}$ atoms/cm$^2$ |
|  K | 8.8 × $10^{10}$ atoms/cm$^2$ |

Having described several embodiments, it will be recognized by those of skill in the art that various modifications, alternative constructions, and equivalents may be used without departing from the spirit of the invention. In particular, while embodiments have been described in detail for high-density plasma system, those of skill in the art will recognize the general applicability of the invention to any substrate processing system that uses a plasma to heat the substrate. Accordingly, the above description should not be taken as limiting the scope of the invention, which is defined in the following claims.

What is claimed is:

1. A method for depositing a layer on a substrate in a process chamber, the method comprising:
    providing a gaseous mixture to the process chamber, the gaseous mixture comprising a silicon-containing gas, an oxygen-containing gas, and a fluorine-containing gas, wherein a ratio of a flow rate of the fluorine-containing gas to a flow rate of the silicon-containing gas is greater than 0.65;
    generating a high-density plasma from the gaseous mixture by applying a source RF power to the gaseous mixture, the source RF power having a power density less than 12 W/cm$^2$;
    applying a bias to the substrate at a bias power density greater than 0.8 W/cm$^2$ and less than 2.4 W/cm$^2$; and
    depositing a fluorinated silicate glass layer onto the substrate using the high-density plasma.

2. The method recited in claim 1 wherein the fluorine-containing gas is silicon tetrafluoride.

3. The method recited in claim 1 wherein the gaseous mixture further comprises a nitrogen-containing gas and wherein the fluorinated silicate glass layer is a nitrofluorinated silicate glass layer.

4. The method recited in claim 1 wherein the fluorinated silicate glass layer is deposited on a silicon nitride layer.

5. The method recited in claim 4 wherein the silicon nitride layer has a hydrogen concentration less than 20 at. %.

6. The method recited in claim 4 wherein the fluorinated silicate glass layer and the silicon nitride layer are deposited as part of a copper damascene process.

7. The method recited in claim 1 further comprising:
    etching the fluorinated silicate glass layer;
    ashing the etched fluorinated silicate glass layer; and
    depositing a layer of metal on the ashed fluorinated silicate glass layer.

8. The method recited in claim 7 wherein the layer of metal is a layer of TaN.

9. The method recited in claim 7 wherein the step of ashing is performed with an $O_2$ chemistry.

10. The method recited in claim 7 further comprising cleaning the fluorinated silicate glass layer with reactive $H_2$ before depositing the layer of metal.

11. The method recited in claim 1 wherein the bias power density is less than 1.8 W/cm$^2$.

12. The method recited in claim 1 further comprising maintaining a pressure in the process chamber greater than 11 mtorr.

13. The method recited in claim 1 wherein the gaseous mixture further comprises a phosphorus-containing gas and wherein the fluorinated silicate glass layer is a phosphosilicate glass layer.

14. The method recited in claim 13 wherein the gaseous mixture further comprises a boron-containing gas and wherein the fluorinated silicate glass layer is a borophosphosilicate glass layer.

15. The method recited in claim 1 wherein the gaseous mixture further comprises an inert gas.

16. The method recited in claim 15 wherein the inert gas is argon.

17. A method for depositing a layer on a substrate in a process chamber, the method comprising:
    providing a gaseous mixture to the process chamber, the gaseous mixture comprising a silicon-containing gas and an oxygen-containing gas;
    generating a high-density plasma from the gaseous mixture;
    applying a bias to the substrate; and
    depositing a silicate glass layer onto the substrate using the high-density plasma,
    wherein the silicate glass layer comprises a hardness of at least 2.0 GPa and comprises a compressive stress.

18. The method recited in claim 17 wherein the gaseous mixture further comprises a fluorine-containing gas and wherein the silicate glass layer comprises a fluorinated silicate glass layer.

19. A computer-readable storage medium having a computer-readable program embodied therein for directing operation of a substrate processing system including a process chamber, a plasma generation system, a substrate holder, and a gas-delivery system configured to introduce gases into the process chamber, the computer-readable program including instructions for operating the substrate processing system to form a layer on a substrate disposed in the process chamber in accordance with the following:
    providing a gaseous mixture to the process chamber, the gaseous mixture comprising a silicon-containing gas, an oxygen-containing gas, and a fluorine-containing gas, wherein a ratio of a flow rate of the fluorine-containing gas to a flow rate of the silicon-containing gas is greater than 0.65;
    generating a high-density plasma from the gaseous mixture by applying a source RF power to the gaseous mixture, the source RF power having a power density less than 12 W/cm$^2$;
    applying a bias to the substrate at a bias power density greater than 0.8 W/cm$^2$ and less than 2.4 W/cm$^2$; and
    depositing a fluorinated silicate glass layer onto the substrate using the high-density plasma.

20. The computer-readable storage medium recited in claim 19 wherein the gaseous mixture further comprises a nitrogen-containing gas and wherein the fluorinated silicate glass layer is a nitrofluorinated silicate glass layer.

21. A substrate processing system comprising:

a housing defining a process chamber;

a high-density plasma generating system operatively coupled to the process chamber;

a substrate holder configured to hold a substrate during substrate processing;

a gas-delivery system configured to introduce gases into the process chamber, including sources for a silicon-containing gas, an oxygen-containing gas, and a fluorine-containing gas;

a pressure-control system for maintaining a selected pressure within the process chamber;

a controller for controlling the high-density plasma generating system, the gas-delivery system, and the pressure-control system; and a memory coupled to the controller, the memory comprising a computer-readable medium having a computer-readable program embodied therein for directing operation of the substrate processing system, the computer-readable program including:

instructions to control the gas-delivery system to provide a gaseous mixture to the process chamber, the gaseous mixture comprising the silicon-containing gas, the oxygen-containing gas, and the fluorine-containing gas, wherein a ratio of a flow rate of the fluorine-containing gas to a flow rate of the silicon-containing gas is greater than 0.65;

instructions to control the high-density plasma generating system to generate a high-density plasma from the gaseous mixture by applying a source RF power to the gaseous mixture, the source RF power having a power density less than 12 W/cm$^2$ and to apply a bias to the substrate at a bias power density greater than 0.8 W/cm$^2$ and less than 2.4 W/cm$^2$; and instructions to control the substrate processing system to deposit a fluorinated silicate glass layer onto the substrate using the high-density plasma.

22. The substrate processing system recited in claim 21 wherein the gas-delivery system further includes a source for a nitrogen-containing gas, the gaseous mixture further includes the nitrogen-containing gas, and the fluorinated silicate glass layer is a nitrofluorinated silicate glass layer.

* * * * *